United States Patent
Watanabe (10) Patent No.: US 9,536,954 B2
(45) Date of Patent: *Jan. 3, 2017

(54) SUBSTRATE WITH SILICON CARBIDE FILM, SEMICONDUCTOR DEVICE, AND METHOD FOR PRODUCING SUBSTRATE WITH SILICON CARBIDE FILM

(71) Applicant: SEIKO EPSON CORPORATION, Tokyo (JP)

(72) Inventor: Yukimune Watanabe, Hokuto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/926,552

(22) Filed: Oct. 29, 2015

(65) Prior Publication Data

US 2016/0126320 A1    May 5, 2016

(30) Foreign Application Priority Data

Oct. 31, 2014 (JP) .................. 2014-223559
Jul. 22, 2015 (JP) .................. 2015-144682

(51) Int. Cl.
*H01L 29/16* (2006.01)
*H01L 29/04* (2006.01)
(Continued)

(52) U.S. Cl.
CPC ....... *H01L 29/1608* (2013.01); *H01L 21/0262* (2013.01); *H01L 21/02381* (2013.01);
(Continued)

(58) Field of Classification Search
CPC ............... H01L 21/02381; H01L 21/02488; H01L 21/02529; H01L 21/0262; H01L 29/04; H01L 29/045; H01L 29/1608
See application file for complete search history.

(56) References Cited

U.S. PATENT DOCUMENTS 5,233,215 A * 8/1993 Baliga ................ H01L 29/0619
                                                         257/339
5,296,086 A    3/1994 Takasu
(Continued)

FOREIGN PATENT DOCUMENTS

JP     H05-29217 A     2/1993
JP     H11-181567 A    7/1999
(Continued)

OTHER PUBLICATIONS

Mar. 16, 2016 Notice of Allowance Issued in U.S. Appl. No. 14/926,914.

*Primary Examiner* — Allan R Wilson
(74) *Attorney, Agent, or Firm* — Oliff PLC (57) ABSTRACT

A substrate with a silicon carbide film includes a silicon substrate, a SiC film, and a mask 4. The SiC film has a film 31 including openings 35 on the silicon substrate and a film 32 provided on the upper side of the film 31. The mask 4 has a mask 41 provided on the upper side of the silicon substrate and including openings 45 and a mask 42 covering at least part of the mask 41 located in the openings 35 and the side surfaces of the openings 35 and including openings 46. The width W1 of the opening 45, the thickness T1 (μm) of the mask 41, and the thickness D (μm) of the film 31 at a position corresponding to the opening 45 satisfy the following relationships: $T1 < \tan(54.6°) \times W1$, and $D \geq \tan(54.6°) \times W1$.

14 Claims, 3 Drawing Sheets

(51) Int. Cl.
*H01L 21/02* (2006.01)
*H01L 29/739* (2006.01)

(52) U.S. Cl.
CPC .. *H01L 21/02447* (2013.01); *H01L 21/02529* (2013.01); *H01L 21/02639* (2013.01); *H01L 21/02647* (2013.01); *H01L 29/04* (2013.01); *H01L 29/045* (2013.01); *H01L 29/7393* (2013.01)

(56) References Cited

U.S. PATENT DOCUMENTS

| | | | |
|---|---|---|---|
| 5,726,463 A * | 3/1998 | Brown | H01L 29/1608 257/288 |
| 2003/0080384 A1* | 5/2003 | Takahashi | C30B 25/02 257/347 |
| 2008/0257409 A1* | 10/2008 | Li | H01L 31/1852 136/259 |
| 2009/0101918 A1* | 4/2009 | Uchida | H01L 21/046 257/77 |
| 2009/0261363 A1* | 10/2009 | Chen | H01L 21/02381 257/95 |
| 2010/0164059 A1 | 7/2010 | Suzuki | |
| 2012/0205670 A1* | 8/2012 | Kudou | H01L 21/0465 257/77 |
| 2012/0235163 A1 | 9/2012 | Watanabe | |
| 2013/0049013 A1* | 2/2013 | Shimada | H01L 21/0237 257/77 |
| 2013/0181230 A1 | 7/2013 | Watanabe | |
| 2013/0228797 A1* | 9/2013 | Nagasawa | H01L 21/02381 257/77 |
| 2015/0236148 A1* | 8/2015 | Masuda | H01L 29/7813 257/77 |
| 2015/0287789 A1 | 10/2015 | Fujiwara et al. | |
| 2015/0325654 A1* | 11/2015 | Corona | H01L 21/02381 438/138 |
| 2016/0126321 A1* | 5/2016 | Watanabe | H01L 29/1608 257/77 |

FOREIGN PATENT DOCUMENTS

| | | |
|---|---|---|
| JP | 2012-195493 A | 10/2012 |
| JP | 2013-035731 A | 2/2013 |
| JP | 2013-149733 A | 8/2013 |

* cited by examiner

SUBSTRATE WITH SILICON CARBIDE FILM, SEMICONDUCTOR DEVICE, AND METHOD FOR PRODUCING SUBSTRATE WITH SILICON CARBIDE FILM

This application claims a priority to Japanese Patent Application No. 2014-223559 filed on Oct. 31, 2014 and Japanese Patent Application No. 2015-1444682 filed on Jul. 22, 2015 which are hereby expressly incorporated by reference in its entirety.

BACKGROUND

1. Technical Field

The present invention relates to a substrate with a silicon carbide film, a semiconductor device, and a method for producing a substrate with a silicon carbide film.

2. Related Art

Silicon carbide (SiC) is a wide band gap semiconductor having a band gap (2.36 to 3.23 eV) two or more times wider than that of Si, and has attracted attention as a material for a high withstand voltage device recently.

However, since the crystal formation temperature of SiC is high unlike Si, it is difficult to form a single crystal ingot by a pulling method from a liquid phase. Therefore, a method in which a single crystal ingot of SiC is formed by sublimation has been proposed. However, it is very difficult to form a substrate having a large diameter and few crystal defects by sublimation. On the other hand, among SiC crystals, cubic SiC (3C—SiC) can be formed at a relatively low temperature, and therefore, a method in which cubic SiC is epitaxially grown directly on a Si substrate (silicon substrate) has been proposed.

As one method for producing a SiC substrate using this epitaxial growth, a heteroepitaxial technique in which 3C—SiC is stacked on a Si substrate in a gas phase has been studied. However, the lattice constants of Si and 3C—SiC are 5.43 Å and 4.36 Å, respectively, and there is an about 20% difference. Further, the thermal expansion coefficient of Si is $2.55 \times 10^{-6}$ $K^{-1}$, and the thermal expansion coefficient of 3C—SiC is $2.77 \times 10^{-6}$ $K^{-1}$, and there is an about 8% difference. Therefore, it is very difficult to obtain a high-quality epitaxial film (3C—SiC film) with few crystal defects from these materials. Further, these differences in the lattice constant and the thermal expansion coefficient result in generating large stress in the 3C—SiC film, and as a result, a problem of warpage of a wafer also occurs.

The crystal defects as described above are mainly so-called twin defects and anti-phase boundary (APB) defects. As a method for reducing these crystal defects, for example, in JP-A-11-181567 discloses a method for effectively reducing crystal defects by forming an oxide film or the like on a growth base substrate, providing an epitaxial growth region using this oxide film or the like as a mask, and setting the thickness T of the oxide film or the like to the width W1 of an opening of the growth region to tan(54.6°)×W1 (tan (54.6°) times) or more. In this case, assuming that the width W1 of an opening is set to, for example, about 0.5 μm, the oxide film or the like to be used as the mask needs to have a thickness T of 0.7 μm or more.

By using a currently available process technique, the difficulty level of a pattern forming process is not so high, however, it is necessary to form a patterned oxide film or the like with high accuracy at a relatively high aspect ratio. Further, the thickness of the oxide film or the like is relatively large, and therefore, a problem that the SiC substrate is warped or the like due to film stress generated in the oxide film or the like occurs.

SUMMARY

An advantage of some aspects of the invention is to provide a substrate with a high-quality silicon carbide film including a 3C—SiC film, which is stacked on a silicon substrate, and in which the occurrence of crystal defects is reduced, a method for producing a substrate with a silicon carbide film capable of producing such a substrate with a silicon carbide film, and a semiconductor device including such a substrate with a silicon carbide film.

The invention can be implemented as the following application examples and embodiments.

A substrate with a silicon carbide film according to an aspect of the invention includes: a silicon substrate; a first mask formed on part of the silicon substrate; a first silicon carbide film formed on the silicon substrate and on the first mask; a second mask formed on at least part of the first silicon carbide film; and a second silicon carbide film formed on the first silicon carbide film and on the second mask, wherein the first mask has multiple first openings where the silicon substrate is exposed, the first silicon carbide film is formed so as to cover the first openings and the first mask, and also has a concave portion with an inclined side surface on an upper portion of the first mask, and the second mask is formed on the concave portion. Further, it is preferred that when the width of an opening portion of the first opening is represented by W1, the thickness of the first mask is represented by T1, and the thickness of the first silicon carbide film in the first opening is represented by D1, the following relationships are satisfied: $T1 < \tan(54.6°) \times W1$, and $D1 \geq \tan(54.6°) \times W1$.

According to this configuration, a substrate with a high-quality silicon carbide film including a 3C—SiC film, which is stacked on a silicon substrate, and in which the occurrence of crystal defects is reduced can be provided.

In the substrate with a silicon carbide film according to the aspect of the invention, it is preferred that the first mask and the second mask have substantially the same shape when the silicon substrate is seen in plan view.

According to this configuration, the occurrence of crystal defects in the second silicon carbide film is accurately suppressed or prevented, and therefore, a substrate with a high-quality silicon carbide film including a 3C—SiC film, in which the occurrence of crystal defects is reduced, can be provided.

In the substrate with a silicon carbide film according to the aspect of the invention, it is preferred that the upper surface of the silicon substrate has a plane orientation of (100).

When the upper surface of the silicon substrate has a plane orientation of (100) in this manner, in a silicon carbide film to be formed on this surface by epitaxial growth, crystal defects grow along the plane orientation of (111). Accordingly, the direction of the growth of crystal defects can be controlled, and thus, a method for reducing the effect of crystal defects can be easily adopted.

In the substrate with a silicon carbide film according to the aspect of the invention, it is preferred that the second silicon carbide film is a cubic silicon carbide film. Further, in the substrate with a silicon carbide film according to the aspect of the invention, it is preferred that the first silicon carbide film is a cubic silicon carbide film.

In a semiconductor device according to an aspect of the invention, it is preferred that the substrate with a silicon carbide film according to the aspect of the invention is used.

According to this configuration, a semiconductor device having a high withstand voltage can be provided.

A method for producing a substrate with a silicon carbide film according to an aspect of the invention includes: a first step of forming a first mask on a silicon substrate; a second step of forming a first silicon carbide film; a third step of forming a second mask; and a fourth step of forming a second silicon carbide film, wherein the first step includes a step of forming a first thin film on the silicon substrate and a step of forming multiple first openings for exposing the silicon substrate in the first thin film, and when the width of the first opening is represented by W1, and the thickness of the first mask is represented by T1, the first openings are formed so as to satisfy the following relationship: $T1 < \tan(54.6°) \times W1$, the second step includes a step of epitaxially growing the first silicon carbide film from the surface of the silicon substrate exposed in the first openings, and when the thickness of the first silicon carbide film in the first opening is represented by D1, the first silicon carbide film is formed so as to satisfy the following relationship: $D1 \geq \tan(54.6°) \times W1$, the third step includes a step of forming a second thin film on the first silicon carbide film and the first mask, and a step of forming multiple second openings for exposing the first silicon carbide film in the second thin film, and the second openings are formed so as to overlap the first openings in plan view, and the fourth step includes a step of forming the second silicon carbide film from the second openings by epitaxial growth. Further, in the method for producing a substrate with a silicon carbide film according to the aspect of the invention, it is preferred that the second silicon carbide film is a cubic silicon carbide film.

According to this configuration, a substrate with a high-quality silicon carbide film including a 3C—SiC film, which is stacked on a silicon substrate, and in which the occurrence of crystal defects is reduced can be produced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a substrate with a silicon carbide film, a method for producing a substrate with a silicon carbide film, and a semiconductor device according to the invention will be described in detail based on preferred embodiments shown in the accompanying drawings. Incidentally, the drawings to be used in the description are for reference only to facilitate the understanding of the description, and the dimensions, ratios, and the like are sometimes different from the actual ones.

First Embodiment

Figure 1:
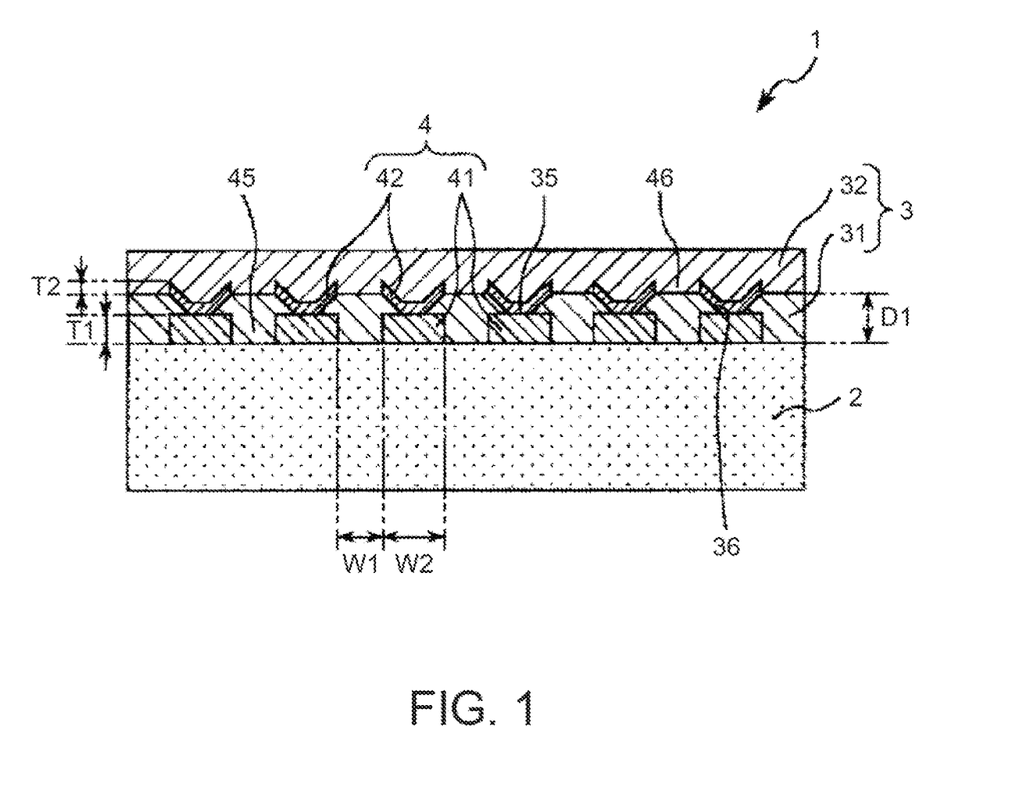
FIG. 1 is a longitudinal cross-sectional view showing an embodiment of a substrate with a silicon carbide film according to the invention.

This embodiment describes a substrate with a silicon carbide film. FIG. 1 is a longitudinal cross-sectional view showing an embodiment of a substrate with a silicon carbide film 1 according to the invention, and is a view seen from the direction perpendicular to the (011) plane of a silicon substrate 2. In the following description, the upper side of FIG. 1 is referred to as "upper", and the lower side of FIG. 1 is referred to as "lower".

As shown in FIG. 1, the substrate with a silicon carbide film (a substrate with a cubic silicon carbide film) 1 has a silicon substrate 2, a 3C—SiC (cubic silicon carbide) film (hereinafter sometimes simply referred to as "SiC film") 3 stacked on the silicon substrate 2, and a mask 4 used when this SiC film 3 is formed. As shown in FIG. 1, the SiC film 3 includes a first SiC film 31 and a second SiC film 32. The mask 4 includes a first mask 41 and a second mask 42.

The silicon substrate 2 is formed by, for example, slicing a silicon single crystal ingot pulled by a CZ method (Czochralski method), followed by polishing. The upper surface of the silicon substrate 2 has a plane orientation of (100). The upper surface of the silicon substrate 2 may be an offset substrate in which a crystal axis is inclined by several degrees. The lattice constant of the silicon substrate 2 is 0.543 nm. The silicon substrate 2 is used as a growth base substrate for forming the first SiC film 31 by a heteroepitaxial technique. In this embodiment, as shown in FIG. 1, as the silicon substrate 2, a silicon single crystal substrate is used, however, the silicon substrate is not limited thereto, and may be, for example, a substrate having a single crystal silicon film formed on a substrate made of quartz, sapphire, or stainless steel, or the like.

The first SiC film 31 is a film formed on the silicon substrate 2 by forming multiple first openings 45 in the first mask 41 such that the silicon substrate 2 is exposed at a predetermined interval, and thereafter, epitaxial growing the film on the silicon substrate 2 exposed in the first openings 45. The first SiC film 31 is formed such that the thickness thereof is thicker than the thickness of the first mask 41.

Here, the first mask 41 is not particularly limited as long as it inhibits the heteroepitaxial growth when forming a silicon carbide film. For example, the first mask 41 may be formed from an inorganic material such as silicon oxide ($SiO_2$) or silicon nitride (SiN). After the first SiC film 31 grows to the same height as that of the first mask 41, it grows not only in the longitudinal direction, but also in the lateral direction on the upper surface of the first mask 41. As a result, the first SiC film 31 is formed in a shape in which a portion overlapping a region of the first opening 45 in plan view becomes the top and has the largest thickness, and a region between a portion overlapping the end of the first opening 45 at the top and a portion of a tip end of the epitaxially grown film on the first mask 41 is inclined. By stopping the epitaxial growth of the first SiC film 31 after a predetermined time, the first SiC film 31 can be brought into a state where part of the upper portion of the first mask 41 is exposed. In this case, a concave shape is formed by the exposed upper portion of the first mask 41 and the inclined surface of the first SiC film 31 on the first mask 41. The concave shaped portion formed on the first mask 41 is an opening 35 (see FIG. 2B).

The second mask 42 is formed on the opening 35. The second mask 42 is a mask formed by patterning a thin film formed on the opening 35 and the first SiC film 31 by a given method. The patterning is performed so that the first mask 41 and the second mask 42 have the same shape in plan view. By doing this, the second mask 42 is configured such that a thin film in a portion corresponding to the upper portion of the first opening 45 is removed. As a result, the end portion of the second mask 42 is formed higher than the first SiC film 31 by the film thickness of the thin film, and a portion where this thin film is removed, that is, a portion where the first SiC film 31 is exposed is a second opening 46.

The second SiC film 32 is a 3C—SiC (cubic silicon carbide) film formed by epitaxial growth on the second opening 46. In the cross-sectional view of the substrate with a silicon carbide film 1 shown in FIG. 1, when the width of the first opening 45 is represented by W1, the thickness of the first mask 41 is represented by T1, and the thickness of the first SiC film 31 in the first opening 45 is represented by D1, by satisfying the following relationships: $T1<\tan(54.6°)\times W1$, and $D1 \geq \tan(54.6°) \times W1$, a stacking fault formed parallel to the (111) plane of the first SiC film 31 is terminated by the second mask 42. Due to this, the stacking fault formed parallel to the (111) plane does not appear on the surface of the first SiC film 31 in the second opening 46, and therefore, the second SiC film 32 is a higher-quality cubic silicon carbide film formed by epitaxial growth without being subject to the stacking fault. Incidentally, in the epitaxial growth, when a film grows higher than the second mask 42, the film also grows so as to cover the second mask 42, and thus, a cubic silicon carbide film is formed also on the concave portion of the second mask 42.

Second Embodiment

This embodiment describes a method for producing the substrate with a silicon carbide film 1 described in the first embodiment (a method for producing a substrate with a silicon carbide film according to the invention).

Figure 2A:
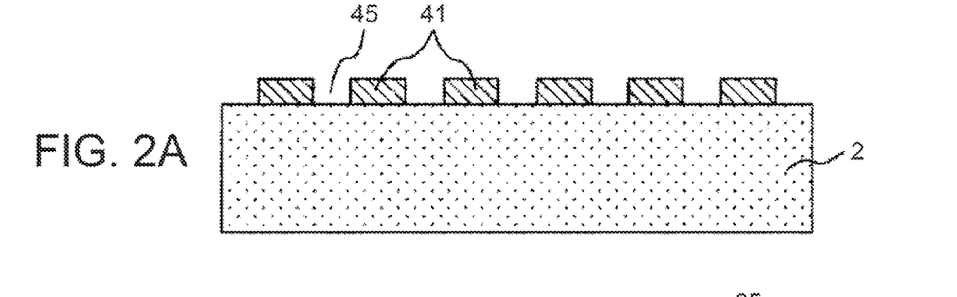
FIGS. 2A to 2D are longitudinal cross-sectional views for illustrating a method for producing the substrate with a silicon carbide film shown in FIG. 1.
Figure 2B:
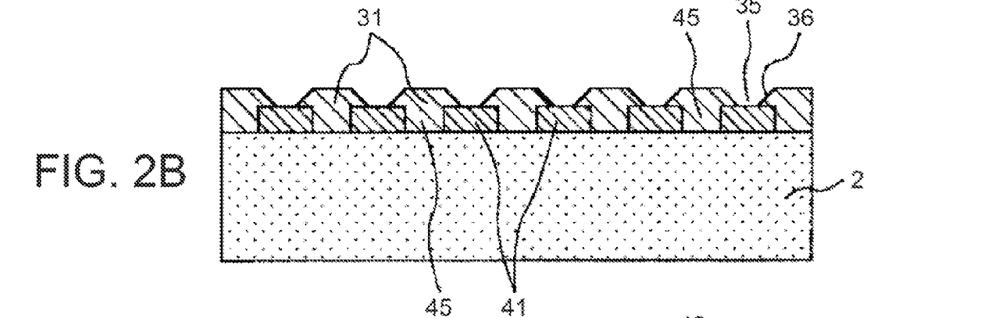
Figure 2C:
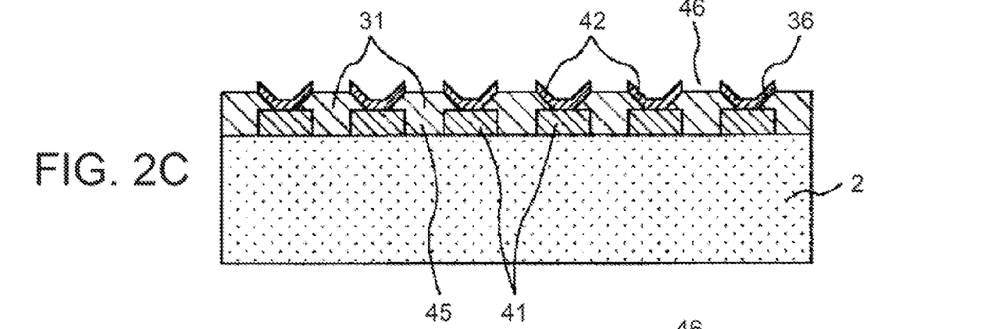
Figure 2D:
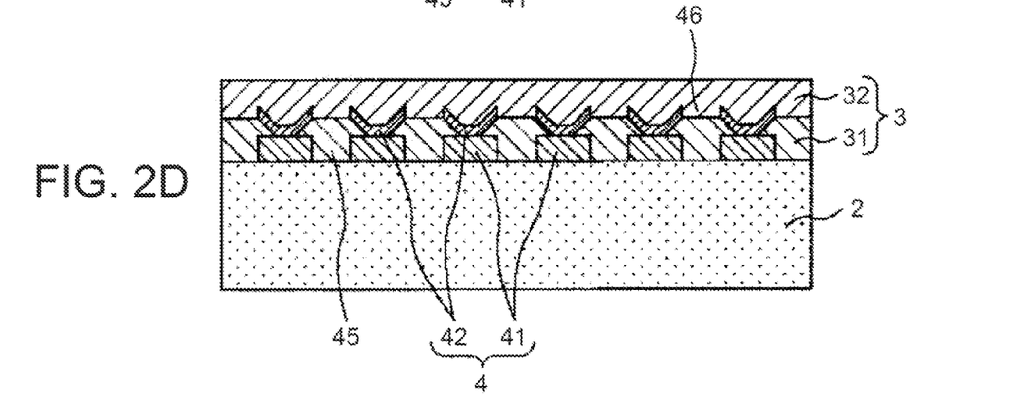
Figure 3:
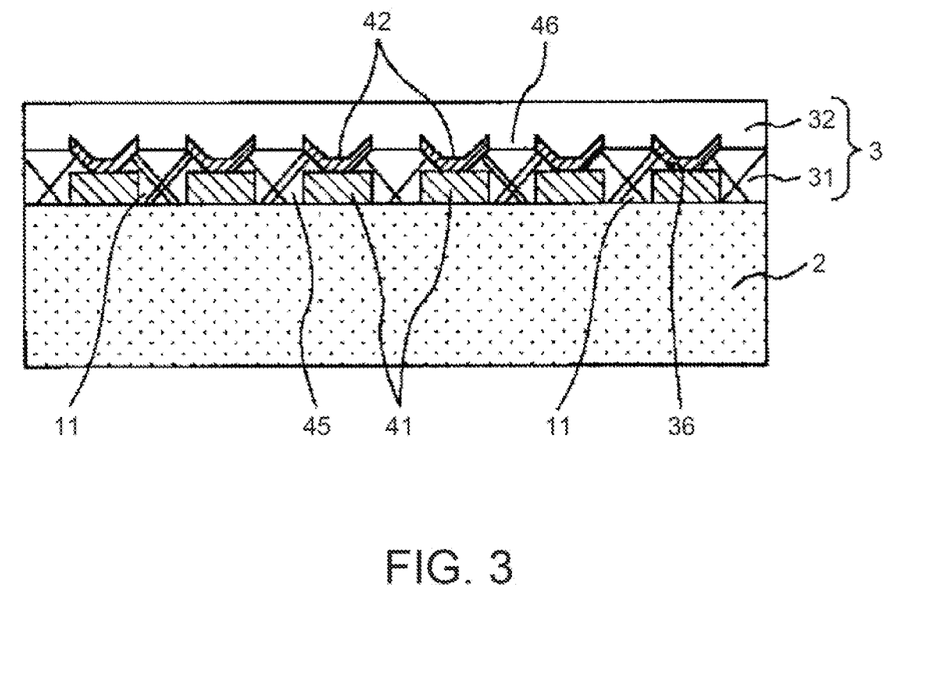
FIG. 3 is a longitudinal cross-sectional view for illustrating a method for reducing crystal defects in the substrate with a silicon carbide film shown in FIG. 1.

FIGS. 2A to 2D are longitudinal cross-sectional views for illustrating a method for producing the substrate with a silicon carbide film 1, and FIG. 3 is a longitudinal cross-sectional view for illustrating a method for reducing crystal defects 11 in the substrate with a silicon carbide film 1, and all the drawings are views seen in the direction perpendicular to the (011) plane of a silicon substrate 2. In the following description, the upper side of FIGS. 2A to 2D and 3 is referred to as "upper", and the lower side of FIGS. 2A to 2D and 3 is referred to as "lower".

The method for producing the substrate with a silicon carbide film 1 includes [1] a first step of forming a first mask 41 having first openings 45 on a silicon substrate 2, [2] a second step of forming a first SiC film 31, [3] a third step of forming a second mask 42, and [4] a fourth step of forming a second SiC film 32. Hereinafter, the respective steps will be sequentially described.

First, the first step will be described. As shown in FIG. 2A, a silicon substrate 2 is prepared, and a first mask 41 having first openings 45 is formed on and in contact with the silicon substrate 2.

The first mask 41 is formed from, for example, an inorganic material such as silicon oxide ($SiO_2$) or silicon nitride (SiN), however, hereinafter, a case where the first mask 41 is formed from silicon oxide will be described as an example.

Such a first mask 41 can be obtained by forming, for example, a silicon oxide film on the silicon substrate 2, and thereafter patterning this silicon oxide film to form the first openings 45.

This first mask 41 has a so-called line and space pattern, in which the longitudinal cross-sectional shape is a rectangle, and this longitudinal cross-sectional shape is substantially the same from the front side to the rear side of the paper, and patterning is performed such that when the width of the first opening 45 is represented by W1 (μm), and the thickness of the first mask 41 is represented by T1 (μm), the following relationship is satisfied: $T1<\tan(54.6°)\times W1$.

The silicon oxide film can be formed by any of various film formation methods, for example, a physical vapor deposition method (PVD method) such as a sputtering method, a chemical vapor deposition method (CVD method), a sol-gel method, or a thermal oxidation method, and above all, it is preferred to form the silicon oxide film using a thermal oxidation method or a CVD method. According to these methods, the silicon oxide film having a desired film thickness can be relatively easily formed with a uniform thickness.

First Example

This example is an example in which a silicon oxide film is formed using a thermal oxidation method. Specifically, an oxygen atom-containing gas is supplied to the silicon substrate 2 having been heated, whereby a silicon oxide film is formed on the surface of the silicon substrate 2.

The temperature when heating (heating temperature) is preferably from about 300 to 1,200° C., more preferably from about 700 to 1,100° C.

The time when heating (heating time) may be appropriately set according to the desired thickness of the silicon oxide film and is not particularly limited, however, for example, in the case where the heating temperature is set within the above range, the heating time is preferably from about 10 to 90 minutes, more preferably from about 20 to 60 minutes.

Examples of the oxygen atom-containing gas include oxygen (pure oxygen), ozone, hydrogen peroxide, water vapor, nitrogen monoxide, nitrogen dioxide, and dinitrogen oxide, and among these, one type or two or more types in combination can be used.

Second Example

This example is an example in which a silicon oxide film is formed using a CVD method. Specifically, a silicon oxide precursor and an oxygen atom-containing gas are introduced into a chamber with a predetermined pressure, and a silicon substrate 2 is heated, whereby a silicon oxide film is formed on the surface of the silicon substrate 2.

Examples of the silicon oxide precursor include dichlorosilane, hexachlorodisilane, tetrakis(hydrocarbylamino)silane, and tris(hydrocarbylamino)silane, among these, one type or two or more types in combination can be used.

Examples of the oxygen atom-containing gas include oxygen (pure oxygen), ozone, hydrogen peroxide, water vapor, nitrogen monoxide, nitrogen dioxide, and dinitrogen oxide, and among these, one type or two or more types in combination can be used.

The temperature when heating (heating temperature) is preferably from about 300 to 1,000° C., more preferably from about 500 to 800° C.

The time when heating (heating time) may be appropriately set according to the desired thickness of the silicon oxide film and is not particularly limited, however, for example, in the case where the heating temperature is set within the above range, the heating time is preferably from about 10 to 90 minutes, more preferably from about 20 to 60 minutes.

The pressure (vacuum degree) in the chamber is preferably from about 0.05 mTorr to atmospheric pressure (760 Torr), more preferably from about 0.1 to 500 mTorr.

The mixing ratio (molar ratio) of the silicon oxide precursor to the oxygen atom-containing gas is preferably from about 10:1 to 1:100, more preferably from about 1:2 to 1:10.

The formed silicon oxide film is patterned to form first openings 45. The patterning of the silicon oxide film using a resist layer can be performed by using either wet etching or dry etching after forming a resist pattern corresponding to the shape of the first openings 45 to be formed, but is preferably performed by using wet etching. By doing this, the side surface of the first mask 41 where the first opening 45 is formed can be made smoother. Due to this, in a second step as the subsequent step, when a first SiC film 31 is formed, the occurrence of a crystal defect in the film of the first SiC film 31 starting at the side surface of the first mask 41 can be accurately reduced.

Further, in the embodiment of the invention, the thickness T1 of the first mask 41 is set to be relatively thin so as to satisfy the following relationship: $T1 < \tan(54.6°) \times W1$ as described above. Due to this, even if wet etching is used for patterning of the silicon oxide film with a resist layer, the first mask 41 having the first openings 45 can be obtained by patterning the silicon oxide film with high accuracy.

Examples of this wet etching include an etching method using a hydrofluoric acid-containing solution as the etching solution.

Examples of the hydrofluoric acid-containing solution include a hydrofluoric acid (HF) solution and a buffered hydrofluoric acid (a mixed solution of hydrofluoric acid (hydrogen fluoride) and ammonium fluoride ($NH_4F$)).

Next, the second step will be described. As shown in FIG. 2B, by using the first mask 41 as a mask, the first SiC film 31 having openings 35 is formed on part of the first mask 41 and the silicon substrate 2.

The first SiC film 31 can be formed by introducing a starting material gas into a chamber with a predetermined pressure, heating the silicon substrate 2 in this state to epitaxially grow cubic silicon carbide (3C—SiC) on the silicon substrate 2 exposed on the bottom of each first opening 45.

By the epitaxial growth, cubic silicon carbide (3C—SiC) is formed starting at the silicon substrate 2 exposed in the first opening 45 so as to cover the silicon substrate 2, and thereafter, accompanying further growth of 3C—SiC, 3C—SiC grows not only on the silicon substrate 2, but also on the first mask 41, resulting in covering also part of the first mask 41 (on an edge side of the first mask 41). By stopping the epitaxial growth after a predetermined time, the opening 35 in a concave shape with an inclined side surface is formed on the first mask 41. As a result, the first SiC film 31 covers the silicon substrate 2 and at least part of the first mask 41. As shown in FIG. 2B, the first SiC film 31, which is discontinuously provided, is formed.

As shown in FIGS. 1 and 2A to 2D, this first SiC film 31 is formed such that the thickness D1 (μm) thereof at a position where the first mask 41 is not present, that is, at a position corresponding to the first opening 45 satisfies the following relationship: $D1 \geq \tan(54.6°) \times W1$.

Further, the first SiC film 31 formed independently by epitaxial growth is configured such that the film thickness tapers off from an edge portion of the first mask 41 to a central portion thereof at a position where it covers the first mask 41 because the film is formed by epitaxial growth. Due to this, a side surface 36 of the opening 35 forms a tapered surface.

Examples of the starting material gas include a mixed gas in which a carbon-containing gas and a silicon-containing gas are mixed at a predetermined ratio, a carbon and silicon-containing gas in which carbon and silicon are contained at a predetermined ratio, and a mixed gas of multiple gases in which a carbon-containing gas, a silicon-containing gas, and a carbon and silicon-containing gas are mixed at a predetermined ratio, and any of these gases is introduced into a chamber as the starting material gas.

Examples of the carbon-containing gas include, in addition to ethylene ($C_2H_4$), acetylene ($C_2H_2$), propane ($C_3H_8$), methane ($CH_4$), ethane ($C_2H_6$), normal butane (n-$C_4H_{10}$), isobutane (i-$C_4H_{10}$), and neopentane (neo-$C_5H_{12}$), and among these, one type or two or more types in combination can be used.

Examples of the silicon-containing gas include monosilane ($SiH_4$), disilane ($Si_2H_6$), trisilane ($Si_3H_8$), tetrasilane ($Si_4H_{10}$), dichlorosilane ($SiH_2Cl_2$), tetrachlorosilane ($SiCl_4$), trichlorosilane ($SiHCl_3$), and hexachlorodisilane ($Si_2Cl_6$), and among these, one type or two or more types in combination can be used.

Examples of the carbon and silicon-containing gas include methylsilane ($SiH_3CH_3$), dimethylsilane ($SiH_2(CH_3)_2$), and trimethylsilan ($SiH(CH_3)_3$), and among these, one type or two or more types in combination can be used.

By performing epitaxial growth using any of these gasses, the first SiC film 31 composed of cubic silicon carbide is formed according to the stoichiometric composition.

The temperature when heating (heating temperature), that is, the temperature of the silicon substrate 2 when performing epitaxial growth is preferably 600° C. or higher and 1,400° C. or lower, more preferably 800° C. or higher and 1,350° C. or lower.

The time when heating (heating time) is appropriately set according to the desired thickness of the first SiC film 31. Depending on the heating time, the first mask 41 is sometimes not exposed on the bottom surface of the opening 35, however, it is an important point that the side surface 36 of the opening 35 is inclined.

The pressure (vacuum degree) in the chamber is preferably $7.5 \times 10^{-7}$ Torr or more and atmospheric pressure (760 Torr) or less, more preferably $7.5 \times 10^{-6}$ Torr or more and 0.5 Torr or less.

Next, the third step will be described. As shown in FIG. 2C, a second mask 42 is formed on each opening 35.

The second mask 42 can be formed by forming a silicon oxide ($SiO_2$) film so as to cover the first SiC film 31 and the openings 35, and then patterning the silicon oxide film. At this time, the height of a tip end portion of the second mask 42 is higher than the height of the first SiC film 31 by the film thickness of the silicon oxide film.

The second mask 42 is patterned so as to have substantially the same plan-view shape as the first mask 41. That is, the second mask 42 has a line and space pattern with a size substantially the same as that of the first mask 41 in plan view. The second mask 42 is placed at a position where it overlaps the first mask 41 in plan view.

The silicon oxide film for forming the second mask 42 can be formed using the same method as described in the above first step, however, above all, it is preferably formed using a CVD method. By using a CVD method, the silicon oxide film having a desired film thickness can be relatively easily formed with a uniform thickness.

The patterning of the silicon oxide film can be performed using the same method as described in the above first step.

Next, the fourth step will be described. As shown in FIG. 2D, a second SiC film 32 is formed on the first SiC film 31 and the second mask 42.

The second SiC film 32 can be formed by introducing a starting material gas into a chamber with a predetermined pressure, and heating the silicon substrate 2 in this state in the same manner as the first SiC film 31 described in the above second step. That is, the second SiC film 32 can be formed by epitaxially growing cubic silicon carbide (3C—SiC) on the first SiC film 31 exposed on the bottom surface of each second opening 46.

By the epitaxial growth, cubic silicon carbide (3C—SiC) is formed starting at the first SiC film 31 exposed in the second opening 46, thereby covering the second opening 46, and thereafter, accompanying further growth of 3C—SiC, 3C—SiC covers not only the second opening 46, but also the second mask 42, and as a result, the second SiC film 32 which covers the first SiC film 31 and the second mask 42 as shown in FIG. 2D is formed.

Here, in the process of epitaxial growth on the silicon substrate 2 exposed in each first opening 45 using the first mask 41 in the second step, in the first SiC film 31 to be formed, many crystal defects 11 occur due to a difference in the lattice constant from the silicon substrate 2.

It is known that when the upper surface of the silicon substrate 2 has a plane orientation of (100), these crystal defects 11 grow along the plane orientation of (111) in the first SiC film 31 to be formed as shown in FIG. 3.

Further, the first mask 41 and the second mask 42 have substantially the same plan-view shape as each other, and are placed at positions where they overlap each other in plan view, and further the first mask 41 satisfies the following relationship: $T1 < \tan(54.6°) \times W1$, and the first SiC film 31 is formed to a thickness such that the thickness D1 of the first SiC film 31 satisfies the following relationship: $D1 \geq \tan(54.6°) \times W1$.

Therefore, the crystal defect 11 occurring in the first opening 45 grows along the plane orientation of (111) in the first SiC film 31. Due to this, an end portion of the crystal defect 11 is concentrated on the side surface 36 of the opening 35 by the first SiC film 31 formed to a thickness satisfying the following relationship: $D1 \geq \tan(54.6°) \times W1$. As a result, as this embodiment, by providing the second mask 42 on substantially the entire surface of the side surface 36 of the opening 35, the crystal defect 11 is terminated by the bottom surface of the second mask 42.

Accordingly, on the first SiC film 31 exposed in the second opening 46, the occurrence of the crystal defect 11 is accurately suppressed or prevented.

Therefore, in the second SiC film 32 formed starting at the upper surface of the first SiC film 31 exposed in the second opening 46, the occurrence of the crystal defect 11 is accurately suppressed or prevented, and therefore, a cubic silicon carbide film to be formed as the second SiC film 32 can be formed as a high-quality film with few crystal defects. Further, since the crystal defects 11 are few, the occurrence of stress in the substrate with a silicon carbide film 1 can be accurately suppressed.

The specific sizes of the first mask 41 and the second mask 42 satisfying the relationship as described above, and also the first SiC film 31 can be set as follows, respectively.

The thickness T1 of the first mask 41 and the thickness T2 of the second mask 42 are independently set as follows: T1 is set to preferably 0.01 μm or more and 14.0 μm or less, more preferably 0.05 μm or more and 7.0 μm or less, and T2 is set to preferably 0.01 μm or more and 1.0 μm or less, more preferably 0.05 μm or more and 0.5 μm or less.

The width W2 of each of the first mask 41 and the second mask 42 is independently set to preferably 0.2 μm or more and 10.0 μm or less, more preferably 0.5 μm or more and 5.0 μm or less. Further, the width W1 of each of the first opening 45 and the second opening 46 is independently set to preferably 0.2 μm or more and 10.0 μm or less, more preferably 0.5 μm or more and 5.0 μm or less.

Further, the thickness D1 of the first SiC film 31 at a position where the first mask 41 is not present, that is, in the first opening 45 is preferably set to 0.28 μm or more and 14.0 μm or less, more preferably 0.7 μm or more and 7.0 μm or less.

In the substrate with a silicon carbide film 1 having such a size, by satisfying the above-mentioned relationships, the occurrence of the crystal defect 11 in the second SiC film 32 can be more accurately suppressed or prevented.

Further, it is not necessary to needlessly increase the film thickness of the first SiC film 31, and therefore, the occurrence of the crystal defect 11 in the second SiC film 32 can be more accurately suppressed or prevented without increasing the film thickness of the SiC film 3.

As described above, the substrate with a silicon carbide film 1 shown in FIG. 1 is obtained.

In this embodiment, a case where the first mask 41 is formed on and in contact with the silicon substrate 2 has been described, however, the invention is not limited to this configuration, and for example, the SiC film 3 may be configured to further include a third SiC film, and the third SiC film is formed on the silicon substrate 2, and the first mask 41 may be formed on and in contact with the third SiC film.

The substrate with a silicon carbide film 1 as described above includes a high-quality cubic silicon carbide film with extremely few crystal defects, and therefore is favorably used as a silicon carbide (SiC) semiconductor expected as a wide band gap semiconductor. Due to this, the substrate with a silicon carbide film 1 can be favorably used in a semiconductor device including a silicon carbide (SiC) semiconductor, and the semiconductor device can be made to have a high withstand voltage.

Examples of this semiconductor device include a metal-oxide-semiconductor field-effect transistor (MOSFET), an insulated-gate bipolar transistor (IGBT), and a Schottky barrier diode (SBD).

Hereinabove, the substrate with a silicon carbide film, the method for producing a substrate with a silicon carbide film, and the semiconductor device according to the invention have been described based on the embodiments shown in the drawings, however, the invention is not limited thereto.

For example, in the method for producing a substrate with a silicon carbide film according to the invention, an arbitrary step can be added as needed.

Further, the configuration of each part in the substrate with a silicon carbide film and the semiconductor device according to the invention can be replaced with an arbitrary configuration having a similar function, and also an arbitrary configuration can be added. Further, the invention can be applied widely within the scope that does not deviate from the gist of the invention.

What is claimed is:
1. A substrate with a silicon carbide film, comprising:
a silicon substrate;
a first mask formed on part of the silicon substrate;
a first silicon carbide film formed on the silicon substrate and on the first mask;
a second mask formed on at least part of the first silicon carbide film; and
a second silicon carbide film formed on the first silicon carbide film and on the second mask, wherein
the first mask has multiple first openings where the silicon substrate is exposed, the first silicon carbide film is formed so as to cover the first openings and the first mask, and also has a concave portion with an inclined side surface on an upper portion of the first mask, and the second mask is formed on the concave portion.

2. The substrate with a silicon carbide film according to claim 1, wherein when the width of an opening portion of the first opening is represented by W1, the thickness of the first mask is represented by T1, and the thickness of the first silicon carbide film in the first opening is represented by D1, the following relationships are satisfied:

$$T1 < \tan(54.6°) \times W1, \text{ and}$$

$$D1 \geq \tan(54.6°) \times W1.$$

3. The substrate with a silicon carbide film according to claim 1, wherein the first mask and the second mask have substantially the same shape when the silicon substrate is seen in plan view.

4. The substrate with a silicon carbide film according to claim 1, wherein the upper surface of the silicon substrate has a plane orientation of (100).

5. The substrate with a silicon carbide film according to claim 1, wherein the second silicon carbide film is a cubic silicon carbide film.

6. The substrate with a silicon carbide film according to claim 1, wherein the first silicon carbide film is a cubic silicon carbide film.

7. A semiconductor device, wherein the substrate with a silicon carbide film according to claim 1 is used.

8. A semiconductor device, wherein the substrate with a silicon carbide film according to claim 2 is used.

9. A semiconductor device, wherein the substrate with a silicon carbide film according to claim 3 is used.

10. A semiconductor device, wherein the substrate with a silicon carbide film according to claim 4 is used.

11. A semiconductor device, wherein the substrate with a silicon carbide film according to claim 5 is used.

12. A semiconductor device, wherein the substrate with a silicon carbide film according to claim 6 is used.

13. A method for producing a substrate with a silicon carbide film, comprising:
    a first step of forming a first mask on a silicon substrate;
    a second step of forming a first silicon carbide film;
    a third step of forming a second mask; and
    a fourth step of forming a second silicon carbide film, wherein
    the first step includes a step of forming a first thin film on the silicon substrate and a step of forming multiple first openings for exposing the silicon substrate in the first thin film, and when the width of the first opening is represented by W1, and the thickness of the first mask is represented by T1, the first openings are formed so as to satisfy the following relationship: $T1 < \tan(54.6°) \times W1$,
    the second step includes a step of epitaxially growing the first silicon carbide film from the surface of the silicon substrate exposed in the first openings, and when the thickness of the first silicon carbide film in the first opening is represented by D1, the first silicon carbide film is formed so as to satisfy the following relationship: $D1 \geq \tan(54.6°) \times W1$,
    the third step includes a step of forming a second thin film on the first silicon carbide film and the first mask, and a step of forming multiple second openings for exposing the first silicon carbide film in the second thin film, and the second openings are formed so as to overlap the first openings in plan view, and
    the fourth step includes a step of forming the second silicon carbide film from the second openings by epitaxial growth.

14. The method for producing a substrate with a silicon carbide film according to claim 13, wherein the second silicon carbide film is a cubic silicon carbide film.

* * * * *